United States Patent [19]
Ochiai et al.

[11] Patent Number: 5,286,600
[45] Date of Patent: Feb. 15, 1994

[54] NEGATIVE PHOTOSENSITIVE COMPOSITION AND METHOD FOR FORMING A RESIST PATTERN BY MEANS THEREOF

[75] Inventors: Tameichi Ochiai, Sagamihara; Noriaki Takahashi, Yokohama; Yasuhiro Kameyama, Machida, all of Japan

[73] Assignee: Mitsubishi Kasei Corporation, Tokyo, Japan

[21] Appl. No.: 926,693

[22] Filed: Aug. 10, 1992

[30] Foreign Application Priority Data

Aug. 27, 1991 [JP] Japan ................................ 3-240548

[51] Int. Cl.$^5$ ................................................ C03F 7/38
[52] U.S. Cl. ............................ 430/270; 430/325; 430/330; 430/927; 430/945; 522/2; 522/129; 522/146
[58] Field of Search ................ 430/270, 325, 330, 927, 430/945; 522/2, 129, 146

[56] References Cited

FOREIGN PATENT DOCUMENTS

| | | |
|---|---|---|
| 0164248 | 12/1985 | European Pat. Off. . |
| 0232972 | 8/1987 | European Pat. Off. . |
| 54-23574 | 8/1979 | Japan . |
| 2-15270 | 1/1990 | Japan . |
| 2-170165 | 6/1990 | Japan . |
| 1539192 | 1/1979 | United Kingdom . |

*Primary Examiner*—Morton Foelak
*Assistant Examiner*—Rachel Johnson
*Attorney, Agent, or Firm*—Oblon, Spivak, McClelland, Maier & Neustadt

[57] ABSTRACT

A negative photosensitive composition comprising (a-1) a compound having at least two organic groups of the following formula (I):

$$-OCH_2OR^1 \qquad (I)$$

wherein $R^1$ is an alkyl group, in its molecule and an alkali-soluble resin, or (a-2) an alkali-soluble resin having at least two organic groups of the above formula (I) in its molecule, and (b) a photo-acid-generating material.

19 Claims, No Drawings

NEGATIVE PHOTOSENSITIVE COMPOSITION AND METHOD FOR FORMING A RESIST PATTERN BY MEANS THEREOF

BACKGROUND OF THE INVENTION

1. Field of the Invention

The present invention generally relates to a negative photosensitive composition sensitive to radiation and a method for forming a resist pattern by means thereof. More particularly, it relates to a negative photosensitive composition useful as a negative photoresist suitable especially for production of semiconductor integrated circuits.

2. Discussion of Background

A negative photoresist in which cyclized rubber and a bisazide compound as a crosslinking agent are used, is well known as a resist useful for photolithography. However, with such a negative photoresist, since swelling takes place during development by the action of an organic solvent used as a developer, the resolution of the resist results in 3 μm at best. Therefore, such a negative photoresist is not suitable for the production of a highly integrated device. Further, the organic solvent used for the development is problematic from the aspects of environmental pollution and health or in view of inflammability.

Whereas, a positive photoresist comprising an alkali-soluble novolak resin and a compound containing a naphthoquinone diazide moiety as a photo-acid-generating material, is well known as a photoresist to which an alkali developer can apply. However, such a positive photoresist has a substantial absorption at 300 nm or less and thus has a drawback that when exposure is conducted at a short wavelength, the pattern profile will be very poor. Therefore, exposure has to be conducted at a wavelength of at least about 350 nm, whereby the resolution is limited, and it is not useful enough for lithography of less than a half micron level.

Although a conventional lithography employing exposure at 350 nm or longer has not sufficient resolutoin, a high level of resolution can be obtained even by employing a light with a wavelength of at least 350 mm such as i-line (365 nm) of a mercury lamp, if exposure is conducted by a phase shifting method using an improved reticle. However, it is well known that for the phase shifting method, a negative resist is more advantageous than the positive resist.

For example, Japanese Unexamined Patent Publication No. 164045/1987 discloses a negative photoresist composed of a combination of an acid curable resin and a photo-acid-generating material. Specifically, such a photoresist contains methoxymethylated melamine (Cymel ® 303, trade name, manufactured by Mitsui Cyanamid) as a crosslinking agent. Japanese Unexamined Patent Publication No. 170165/1990 discloses a radiation sensitive composition which comprises a compound capable of generating an acid when irradiated with a radiation and an alkali-soluble phenol resin containing methoxymethyl groups, methylol groups or both of them, particularly an alkali-soluble polymer having at least structural units of the following formula:

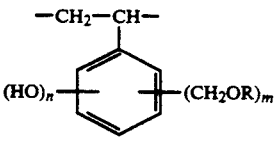

wherein each of n and m is an integer of 1 or 2, and R is hydrogen or methyl.

However, it is still desired to develop a negative photoresist having various properties including resolution further improved.

SUMMARY OF THE INVENTION

Under these circumstances, it is an object of the present invention to provide a negative photosensitive composition useful as a negative photoresist, which is suitable for exposure by a phase shifting method or with a light of short wavelength in the deep UV region and which undergoes no swelling during the development and is capable of presenting a pattern profile suitable for lithography of less than a half micron level.

The present inventors have conducted extensive studies to accomplish the above object and as a result, have found that a compound having a specific structure is readily decomposed by an acid and thus acts as crosslinking agent for an alkali-soluble resin.

The present invention has been accomplished after further studies on the basis of the above discovery and is based on a discovery that the above object can readily be accomplished by a composition comprising the above compound and a photo-acid-generating material, and, if necessary, an alkali-soluble resin.

The present invention provides a negative photosensitive composition comprising (a-1) a compound having at least two organic groups of the following formula (I):

wherein $R^1$ is an alkyl group, in its molecule and an alkali-soluble resin, or (a-2) an alkali-soluble resin having at least two organic groups of the above formula (I) in its molecule, and (b) a photo acid-generating material.

The present invention also provides a method for forming a resist pattern on a substrate for a semiconductor, which comprises coating the above negative photosensitive composition of the present invention on the substrate, heating and drying it, then subjecting it to exposure by means of a mercury lamp or excimer laser to copy a pattern, further subjecting it to heat treatment and then developing it with an alkali aqueous solution to form a resist pattern on the substrate.

DETAILED DESCRIPTION OF THE PREFERRED EMBODIMENTS

Now, the present invention will be described in detail.

The photosensitive composition of the present invention is required to contain (a-1) a compound having at least two organic groups of the above formula (I) in its molecule and an alkali-soluble resin, or (a-2) an alkali-soluble resin having at least two organic groups of the above formula (I) in its molecule. In the case of (a-1), the compound having at least two organic groups of the above formula (I) in its molecule, will be decomposed by the action of a photo-acid-generating material which will be described hereinafter and acts as a crosslinking agent for the alkali-soluble resin, and it will be polymerized with the alkali-soluble resin to cure the latter. On the other hand, in the case of (a-2), the alkali-soluble resin having at least two organic groups of the above formula (I) in its molecule, will itself be decomposed by the action of the after-described photo-acid-generating material to form crosslinkable groups, and the alkali-soluble resin will itself be polymerized and cured by the action of such crosslinkable groups.

The compound having at least two organic groups of the above formula (I) in its molecule (hereinafter referred to simply as the "alkoxymethoxy group-containing compound"), or the alkali-soluble resin having at least two organic groups of the above formula (I) in its molecule (hereinafter referred to simply as the "alkoxymethoxy group-containing resin"), can be obtained, for example, by converting OH groups of a compound having hydroxyl groups, or of an alkali-soluble resin having hydroxyl groups, to $OCH_2OR^1$ groups, respectively.

The compound having hydroxyl groups includes, for example, alcohols and phenols. Preferred are phenols. Such phenols include, for example, phenols having the following structures (1) to (3):

(1) Phenols having a structure in which a plurality of structures each having one hydroxyl group bonded to one aromatic ring are connected directly or via an at least bivalent organic group;

(2) Polyhydric phenols having a structure in which at least two hydroxyl groups are bonded to one aromatic ring; and (3) Polyhydric phenols having a structure in which a plurality of the structures of the above (2), or a plurality of structures including a structure of the above (2) and a structure having one hydroxyl group bonded to one aromatic ring, are connected directly or via an at least bivalent organic group.

As the phenols corresponding to the above (1), compounds of the following formulas (i) to (iii) are preferred.

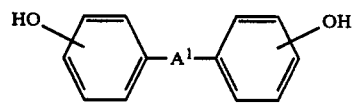

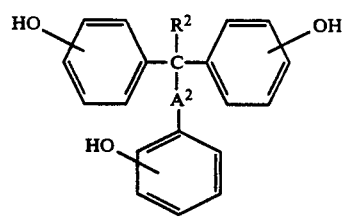

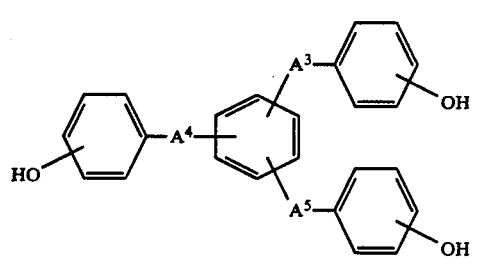

In the above formulas (i) to (iii), each of $A^1$ to $A^5$ is a lower alkylene, phenylene or lower alkylenephenylene group which may have a substituent, or a direct bond, and $R^2$ is a hydrogen atom, or a lower alkyl or phenyl group which may have a substituent. The substituent for each of $A^1$ to $A^5$ and $R^2$ is usually an alkyl group having not more than 3 carbon atoms. Further, the carbon number of the lower alkylene moiety of the lower alkylene group or the lower alkylenephenylene group is usually at most 6, preferably at most 4. The carbon number of the lower alkyl group for $R^2$ is usually at most 3.

The above alkylenephenylene group is a group of the formula —X—Y— or —Y—X—, where —X— is an alkylene group, and —Y— is a phenylene group (the same applies hereinafter).

As the polyhydric phenols corresponding to the above (2), catechol, resorcinol and pyrogallol may, for example, be preferred. As the polyhydric phenols corresponding to the above (3), compounds of the following formula (iv) may be mentioned:

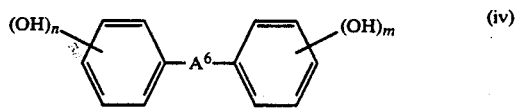

In the above formula (iv), $A^6$ is a lower alkylene, phenylene or lower alkylenephenylene group which may have a substituent, and each of n and m is an integer, provided that either one of them is an integer of at least 2. The carbon number of the lower alkylene moiety of the lower alkylene group or the lower alkylenephenylene group is usually at most 6, preferably at most 4. Further, the substituent for $A^6$ is usually an alkyl group having at most 3 carbon atoms. Further, the polyhydric phenols corresponding to the above (3) include compounds obtained by condensing polyhydric phenols corresponding to the above (2) with aldehydes or ketones. Further, phenol compounds of the general formula disclosed in the upper left column on page 6 of Japanese Unexamined Patent Publication No. 189644/1989, may also be used.

Among the phenols corresponding to the above (1) to (3), those corresponding to the above (1) are particularly preferred from the viewpoint of the efficiency of the reaction to bond —$CH_2OR^1$ groups. Specifically, the compounds of the above formulas (i) to (iii) are preferred.

On the other hand, as the alkali-soluble resin having hydroxyl groups, a polymer having repeating units of the following formula (v) or (vi) may be mentioned:

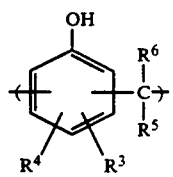

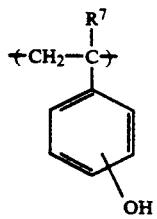
(vi)

In the above formulas (v) and (vi), each of $R^3$ to $R^7$ is a hydrogen atom or a lower alkyl group. The carbon number of the lower alkyl group is usually at most 3. Further, a structure in which benzene rings are not conjugated, is preferred, when the light absorption of the resist film at the wavelength of exposure is taken into consideration.

On the other hand, as the compound to be used for converting OH groups of above mentioned compound having hydroxyl groups or of the above mentioned alkali-soluble resin having hydroxyl groups, to OCH$_2$OR$^1$ groups, the alkoxymethane such as dimethoxymethane (CH$_3$O—CH$_2$—OCH$_3$) may typically be mentioned.

Particularly preferred as the alkoxymethoxy group-containing compound, are compounds of the following formulas (vii) to (xii)

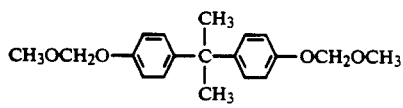
(vii)

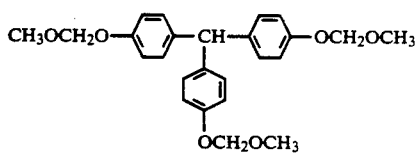
(viii)

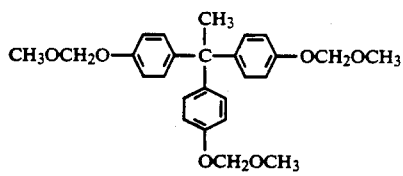
(ix)

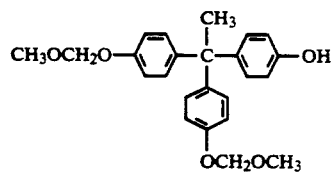
(x)

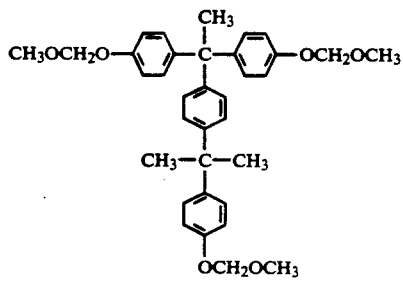
(xi)

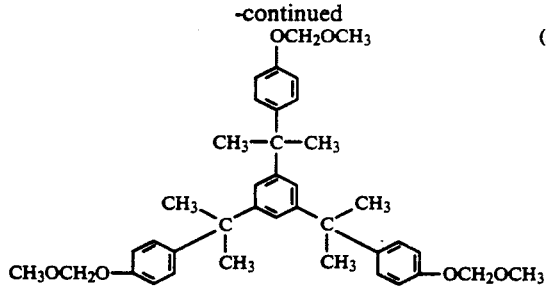
(xii)

On the other hand, as the alkoxymethoxy group-containing resin, a copolymer having repeating units of the following formula (xiii) or (xiv) is preferred:

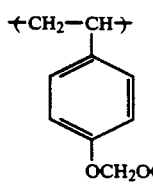 and 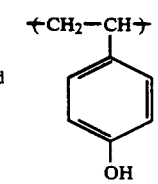
(xiii)

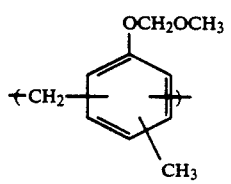 and 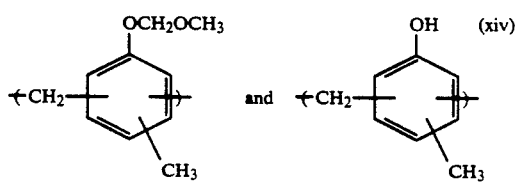
(xiv)

Each of the compounds of the above formulas (vii) to (xii) can be obtained by reacting dimethoxymethane with the corresponding phenol as described in the above (1).

The copolymer having repeating units of the above formula (xiii) or (xiv) can be obtained by reacting dimethoxymethane with a copolymer in which the methoxymethoxy group in the above formula (xiii) or (xiv) is a hydroxyl group.

As mentioned above, the alkoxymethoxy group-containing resin itself will form crosslinkable groups by the action of a photo-acid-generating material which will be described hereinafter, and will be polymerized by itself by the action of such crosslinkable groups, whereby it is unnecessary to incorporate a separate alkali-soluble resin to the photosensitive composition. For example, the copolymer having repeating units of the above formula (xiii) or (xiv), can be used as the alkali-soluble resin, when it is formed as a polymer having an average molecular weight of from about 1,000 to 100,000.

On the other hand, when the alkoxymethoxy group-containing compound is used as a crosslinking agent, it is necessary to incorporate an alkali-soluble resin separately to the composition of the present invention. As such an alkali-soluble resin, a resin having phenolic hydroxyl groups and having a transmittance with a film thickness of 1 μm of at least 20% at any optional exposure wavelength within a range of from 150 to 400 nm, is preferred. Such a resin may, for example, be a novolak resin obtained by polycondensing a hydroxyl aromatic compound such as phenol, m-cresol, p-cresol, ethylphenol, t-butylphenol, xylenol, naphthol, 1,4-dihydroxybenzene or 1,3-dihydroxybenzene, with an aldehyde such as formaldehyde, acetaldehyde, benzaldehyde or furfural, a polymer of a vinylphenol optionally having lower alkyl such as methyl or ethyl substituted on the benzene ring or on the vinyl group, i.e. a polyvinylphenol which may have a substituent such as lower alkyl, an N-(p-hydroxyphenyl)maleimide (co)polymer or a hydroxyphenyl(meth)acrylamide (co)polymer.

In the present invention, the photo-acid-generating material to be used, is preferably a photo-acid-generating material which is able to generate an acid with a light within a range of from 150 to 400 nm. For example, it may be an onium salt or a sulfonic acid ester as disclosed by J. V. Cribelo in Polymeric Materials Science And Engineering, vol 61, p. 63 (American Chemical Society), or a photosensitive organic halogen compound as disclosed in Japanese Examined Patent Publication No. 23574/1979.

Specific examples of the onium salt include iodonium salts such as diphenyl iodonium triflate, diphenyl iodonium tosylate, diphenyl iodonium hexafluoroarsenate, diphenyl iodonium hexafluorophosphonate and diphenyl iodonium tetrafluoroborate; and sulfonium salts such as triphenylsulfonium triflate, triphenylsulfonium tosylate, triphenylsulfonium hexafluoroarsenate, triphenylsulfonium hexafluorophosphonate and triphenylsulfonium tetrafluoroborate.

Specific examples of the sulfonic acid ester include methyl p-toluenesulfonate, ethyl p-toluenesulfonate, butyl p-toluenesulfonate, phenyl p-toluenesulfonate, benzoin p-toluenesulfonate and $\beta$-tosyloxypropiophenone.

Specific examples of the photosensitive organic halogen compound include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris(tribromomethyl)-s-triazine, tris(dibromomethyl)-s-triazine and 2,4-bis(tribromomethyl)-6-p-methoxyphenyl-s-triazine; halogen-containing benzenes such as bis(dibromomethyl)benzene, bis(trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate.

Among the above mentioned various photo-acid-generating materials, a photo-acid-generating material containing bromine or iodine, particularly a bromine-containing photo-acid-generating material, is preferred from the viewpoint of the resolution, the dissolving rate and the storage stability. In a case where the photosensitive composition of the present invention is a composition comprising the alkali-soluble resin, the alkoxymethoxy group-containing compound and the photo-acid-generating material, the alkoxymethoxy group-containing compound is used usually in an amount of from 1 to 50 parts by weight, preferably from 5 to 30 parts by weight, per 100 parts by weight of the alkali-soluble resin, and the photo-acid-generating material is used usually in an amount of from 0.05 to 20 parts by weight, preferably from 0.1 to 10 parts by weight, per 100 parts by weight of the alkali-soluble resin.

On the other hand, in a case where the photosensitive composition of the present invention is a composition comprising the alkoxymethoxy group-containing resin and the photo-acid-generating material, the photo-acid-generating material is used usually in an amount of from 1 to 100 parts by weight, preferably from 5 to 50 parts by weight, per 100 parts by weight of the alkoxymethoxy group-containing resin.

Further, a spectral sensitizer may be incorporated to the negative photosensitive composition of the present invention, whereby it becomes possible to shift the sensitive wavelength region to the long wavelength side and to make the composition sensitive to the i-line (365 nm) of the mercury lamp. The sensitizer is not particularly limited, and any compound having spectral sensitizing effects can be employed. Specifically, it may, for example, be an aromatic amine such as N-phenyl-1-naphthylamine, N,N-diphenyl-naphthylamine, aminopyrene, N-phenylaminopyrene, N,N-diphenylaminopyrene, triphenylamine, hydroxytriphenylamine or N-phenyl-N-benzyl-1-naphthylamine, a phenothiazine which may be unsubstituted or substituted by e.g. alkyl, amino or alkoxy, or phenoxazine. Preferred is a phenothiazine.

The sensitizer is used usually in an amount of from 0.1 to 30 parts by weight, per 100 parts by weight of the alkali-soluble resin or the alkoxymethoxy group-containing resin.

The negative photosensitive composition of the present invention is used usually by dissolving it in a solvent. The solvent is not particularly limited, so long as it is a solvent capable of presenting adequate solubility to the various components and capable of providing a good coating property. For example, it may be a cellosolve type solvent such as methyl cellosolve, ethyl cellosolve, methyl cellosolve acetate or ethyl cellosolve acetate, a propylene glycol type solvent such as propylene glycol monoethyl ether, propylene glycol monobutyl ether, propylene glycol monomethyl ether acetate, dipropylene glycol dimethyl ether or propylene glycol monoethyl ether acetate, an ester type solvent such as butyl acetate, amyl acetate, ethyl butyrate, butyl butyrate, diethyl oxalate, ethyl pyruvate, ethyl-2-hydroxybutyrate, methyl acetoacetate, methyl lactate, ethyl lactate or methyl 3-methylpropionate, an alcohol type solvent such as heptanol, hexanol, diacetone alcohol or furfuryl alcohol, a ketone type solvent such as cyclohexanone or methylamyl ketone, or an ether type solvent such as methyl phenyl ether or diethylene glycol dimethyl ether, a high polar solvent such as dimethylformamide or N-methylpyrrolidone, or a solvent mixture thereof, or a solvent mixture having an aromatic hydrocarbon added thereto.

The solvent is used preferably in an amount of from 1 to 20 times by weight relative to the total amount of the solid content of the photosensitive composition.

The negative photosensitive composition of the present invention is useful as a photoresist. To form a resist pattern on a substrate for a semiconductor by using the negative photosensitive composition of the present invention, the negative photosensitive composition resolved in the above-mentioned solvent is usually coated on the substrate for the semiconductor and then subjected to exposure to copy a pattern, heating after the exposure (post exposure bake: PEB) and development.

The substrate for the semiconductor is the one commonly used as a substrate for the production of semiconductors, and it may, for example, be a silicon substrate or a gallium-arsenic substrate. For the coating, a spin coater is usually employed, and the film thickness is usually from 0.5 to 2 μm.

For the exposure, a light in the deep UV region, for example, a light of 254 nm from a light source of a low pressure mercury lamp, or a light of 157 nm, 193 nm, 222 nm or 249 nm from a light source of e.g. an excimer laser, is suitably employed. Further, a light of 365 nm or 436 nm from a high pressure mercury lamp may also be employed. The light for the exposure may not necessarily be a monochromatic light and may be broad. Further, exposure by a phase shifting method may be applied.

The heating after exposure (PEB) is preferably conducted under such conditions as from 90° to 140° C. for from 1 to 10 minutes by means of a hot plate. Instead of the hot plate, a convection oven may be employed. In this case, however, a longer time is usually required than in the case where a hot plate is employed.

As a developer, an alkali developer is suitably employed which is an aqueous solution of an alkaline compound, such as an inorganic alkali such as potassium hydroxide, sodium carbonate, sodium silicate, sodium metasilicate or aqueous ammonia, a primary amine such as ethylamine or n-propylamine, a secondary amine such as diethylamine or di-n-propylamine, a tertiary amine such as triethylamine or trimethylamine or a quaternary ammonium salt such as tetramethylammonium hydroxide or trimethylhydroxyethylammonium hydroxide. To the developer, an alcohol, a surfactant, etc. may be incorporated as the case requires.

The photoresist solution and the developer are usually filtered to remove insolubles before use.

The negative photosensitive composition of the present invention is useful not only for the production of very large scale integrated circuits, but also for the production of common integrated circuits. Further, it is useful as a material for the production of liquid crystal plates, for the production of masks, for the preparation of printed circuits or for solder resists, or as a material for forming an image. It is also useful for e.g. a UV coating material.

As described in the foregoing, the present invention provides a negative photosensitive composition useful as a negative photoresist whereby exposure by a phase shifting method as well as exposure with a short wavelength in the deep UV region is possible, no swelling takes place during the development and a pattern profile excellent for half micron lithography can be obtained. The negative photosensitive composition of the present invention is particularly useful as a photoresist for the production of integrated circuits and very large scale integrated circuits.

Now, the present invention will be described in detail with reference to Examples. However, it should be understood that the present invention is by no means restricted by such specific Examples.

PREPARATION EXAMPLE 1

Preparation of an Alkoxymethoxy Group-Containing Compound 42.5 g (0.1 mol) of the following trisphenol compound (xv),

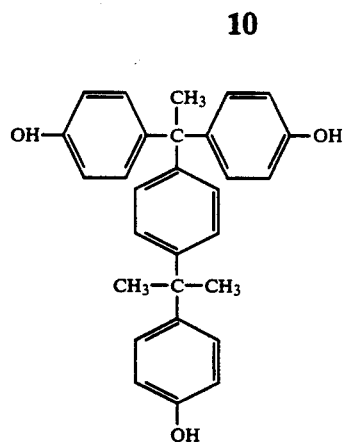

152 g (2 mols) of dimethoxymethane and 0.5 g of p-toluenesulfonic acid were dissolved in 200 g of dichloromethane, and the solution was refluxed for 6 hours by means of a Soxhlet's extractor.

For the refluxing, 85 g of molecular sieve A4 was packed into a cylindrical filter paper of the Soxhlet's extractor. From the formed azeotropic mixture of methanol and dichloromethane, methanol was removed. The azeotropic point was $CH_2Cl_2/CH_3OH = 94/6$ (weight ratio). Then, 76 g of dimethoxymethane and 0.25 g of p-toluenesulfonic acid dissolved in 100 g of dichloromethane, was further added thereto, followed by refluxing for 10 hours.

Then, 2.02 g (0.02 mol) of triethylamine was added thereto, and the mixture was washed twice with a 1N potassium hydroxide aqueous solution and twice with a dilute potassium chloride aqueous solution and then dried over sodium sulfate. Further, the solvent was distilled off at 45° C. to obtain a compound of the above formula (xi).

PREPARATION EXAMPLE 2

Preparation of an Alkoxymethoxy Group-Containing Compound

A compound of the above formula (ix) was prepared in the same manner as in Preparation Example 1 except that 0.7 g (0.1 mol) of the following triphenol compound (xvi)

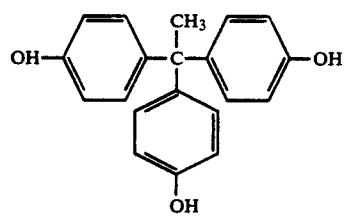

was used as the trisphenol compound in Preparation Example 1.

PREPARATION EXAMPLE 3

Preparation of an Alkoxymethoxy Group-Containing Resin 30 g of polyvinylphenol (tradename PHM-C, manufactured by Maruzen Oil Co. Ltd.) was dissolved in 300 ml of dimethoxymethane. Then, 0.25 g of p-toluenesulfonic acid was added thereto, followed by refluxing for 5 hours.

The reaction solution was cooled to room temperature, and 4 ml of triethylamine was added thereto. The obtained solution was dropwise added to 1.5 l of water. The mixture was stirred for 20 minutes, and the aqueous phase was separated, and 600 ml of water was added to the remaining viscous solid. The mixture was stirred for further 20 minutes, and then the solid was collected by filtration and dried under reduced pressure to obtain a copolymer (weight average molecular weight: 6,000) comprising repeating units of the above formula (xiii).

EXAMPLE 1

20 g of a polyvinylphenol having a weight average molecular weight of 5,000, 4 g of the alkoxymethoxy group-containing compound (xi) obtained in the above Preparation Example 1 and 1.7 g of 2,3-dibromosulfolane were dissolved in 80 g of cyclohexanone, and the solution was filtered through a teflon filter paper of 0.2 μm to obtain a photoresist composition.

This photoresist composition was coated in a thickness of 1.0 μm on a silicon wafer having a diameter of 4 inch by a spin coater (1H-2D, manufactured by Mikasa), followed by drying at 100° C. for 70 seconds on a hot plate.

Then, the coated wafer was subjected to exposure by changing the exposure energy by means of an excimer laser reduction step-and-repeat projection exposure apparatus. Then, the wafer was heated at 110° C. for 90 seconds on a hot plate (PEB). Then, it was developed for 70 seconds with a 1.23% tetramethyl ammonium hydroxide aqueous solution to form a negative image.

The obtained resist pattern was inspected by a scanning electron microscope (manufactured by Akashi Seisakusho), whereby the resolution was excellent (a line and space of 0.35 μm was resolved), the optimum exposure energy was practically problem-free, the sensitivity was excellent (20 mJ/cm$^2$), the dissolving rate of the none-exposed portion was sufficiently high (700 Å/sec), and the developing property was excellent.

EXAMPLE 2

The photoresist composition was prepared in the same manner as in Example 1 except that in Example 1, the compound of the formula (ix) obtained in Preparation Example 2 was used as the alkoxymethoxy group-containing compound, and evaluated in the same manner. The resolution was excellent (a line and space of 0.35 μm was resolved), and the sensitivity was also excellent (25 mJ/cm$^2$).

EXAMPLE 3

20 g of the copolymer obtained in Preparation Example 3 and 1 g of diphenyliodonium triflate were dissolved in 60 g of cyclohexanone to obtain a photoresist composition, and evaluation was conducted in the same manner as in Example 1. The resolution was excellent (a line and space of 0.35 μm was resolved), and the developing property was also excellent.

COMPARATIVE EXAMPLE 1

A photoresist composition was prepared in the same manner as in Example 3 except that instead of the copolymer obtained in Preparation Example 3, 20 g of Cymel ® 300 (manufactured by Mitsui Cyanamid) was used, and the evaluation was conducted in the same manner as in Example 3, whereby the resolution was poor at a level of 2 μm.

COMPARATIVE EXAMPLE 2

A photoresist composition was prepared in the same manner as in Example 3 except that instead of the copolymer prepared in Preparation Example 3, 20 g of solid resol having the following structure:

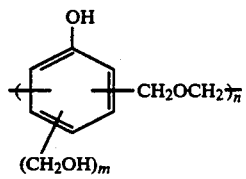

wherein m is 1 or 2, and n is 3 or 4, was used, and evaluation was conducted in the same manner as in Example 3, whereby the resolution was poor at a level of 2 μm.

What is claimed is:

1. A negative photosensitive composition, comprising: (a-1) an aromatic compound having at least two organic groups of formula (I):

$$—OCH_2OR^1 \quad (I)$$

wherein $R^1$ is an alkyl group, in its molecule and an alkali-soluble resin having phenolic groups, or (a-2) an alkali-soluble resin having at least two organic groups of the above formula (I) in its molecule; and (b) a photo-acid-generating material, said aromatic compound (a-1), upon acid decomposition of the —OCH$_2$OR$^1$ groups, acting as a cross-linking agent for the alkali-soluble resin.

2. The negative photosensitive composition according to claim 1, wherein the compound having at least two organic groups of the formula (I) in its molecule, is a compound having the organic groups of the formula (I) substituted for at least two hydroxyl groups of at least one phenol selected from the group consisting of (1) phenols having a structure in which a plurality of structures each having one hydroxyl group bonded to one aromatic ring, are connected directly or via an at least bivalent organic group, (2) polyhydric phenols having a structure in which at least two hydroxyl groups are bonded to one aromatic ring, and (3) polyhydric phenols having a structure in which a plurality of structures each having at least two hydroxyl groups bonded to one aromatic ring, or a plurality of structures including a structure having at least two hydroxyl groups bonded to one aromatic ring and a structure having one hydroxyl group bonded to one aromatic ring, are connected directly or via an at least bivalent organic group.

3. The negative photosensitive composition according to claim 1, wherein the compound having at least two organic groups of the formula (I) in its molecule, is a compound having the organic groups of the formula (I) substituted for at least two hydroxyl groups of at least one phenol selected from the group consisting of compounds of the following formulas (i) to (iv):

-continued

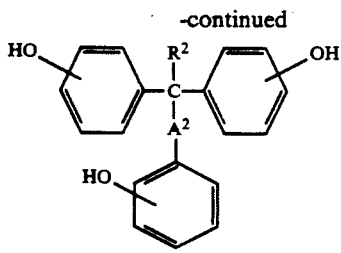
(ii)

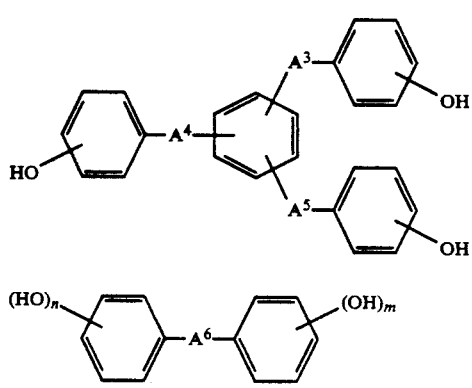
(iii)

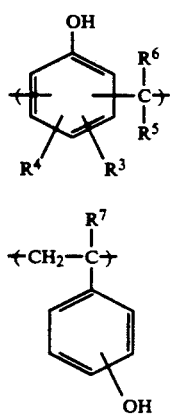
(iv)

wherein each of $A^1$ and $A^6$ is a lower alkylene, phenylene or lower alkylenephenylene group which may have a substituent, or a direct bond, $R^2$ is a hydrogen atom or a lower alkyl or phenyl group which may have a substituent, each of n and m is an integer, provided that either one of n and m is an integer of at least 2, or a compound having the organic groups of formula (I) substituted for at least two hydroxyl groups of a polyhydric phenol having a structure wherein at least two hydroxyl groups are bonded to one aromatic ring.

4. The negative photosensitive composition according to claim 3, wherein the compound having at least two organic groups of the formula (I) in its molecule, is a compound having the organic groups of the formula (I) substituted for at least two hydroxyl groups of a phenol of the formula (ii).

5. The negative photosensitive composition according to claim 1, wherein the alkali-soluble resin having at least two organic groups of the formula (I) in its molecule, is a compound having the organic groups of the formula (I) substituted for at least two hydroxyl groups of a polymer having repeating units of the following formula (v) or (vi):

(v)

$+CH_2-\overset{R^7}{\underset{|}{C}}+$ (vi)

wherein each of $R^3$ or $R^7$ is a hydrogen atom or a lower alkyl group.

6. The negative photosensitive composition according to claim 5, wherein the alkali-soluble resin having at least two organic groups of the formula (I) in its molecule, is a compound having the organic groups of the formula (I) substituted for at least two hydroxyl groups of a polymer having repeating units of the formula (vi).

7. The negative photosensitive composition according to claim 1, wherein the compound having at least two organic groups of the formula (I) in its molecule, is a compound selected from the group consisting of compounds of the following formulas (vii) to (xii):

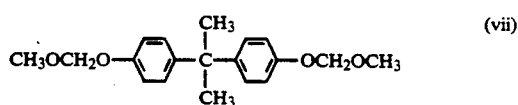
(vii)

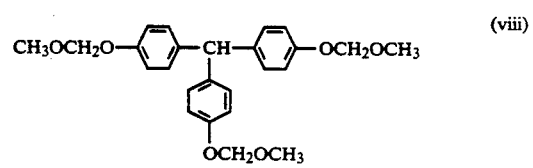
(viii)

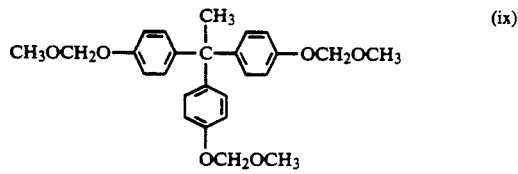
(ix)

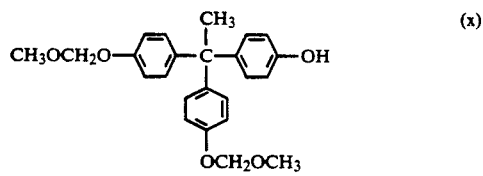
(x)

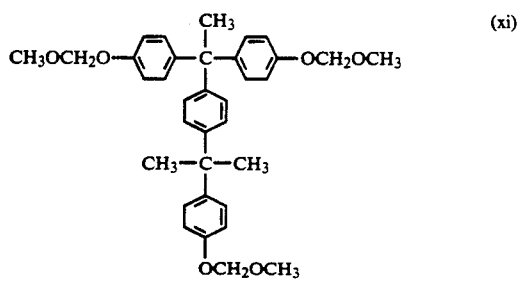
(xi)

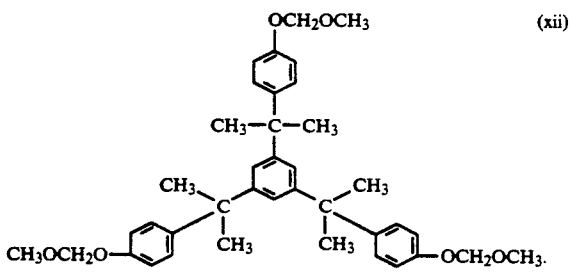
(xii)

8. The negative photosensitive composition according to claim 1, wherein the alkali-soluble resin having at least two organic groups of the formula (I) in its molecule, is a polymer having repeating units of the following formula (xiii) or (xiv):

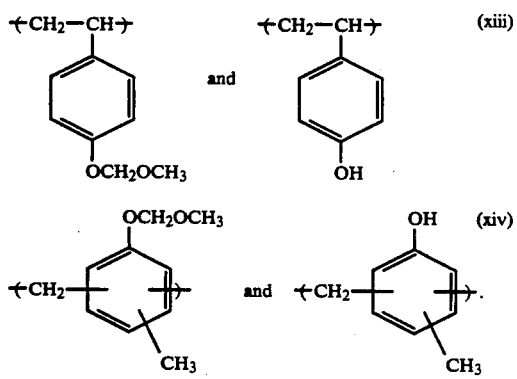

9. The negative photosensitive composition according to claim 1, wherein the alkali-soluble resin is a polyvinylphenol.

10. The negative photosensitive composition according to claim 1, wherein the alkali-soluble resin is a novolak resin.

11. The negative photosensitive composition according to claim 1, wherein the alkali-soluble resin is a polycondensation product of cresol with formaldehyde.

12. The negative photosensitive composition according to claim 1, wherein the photo-acid-generating material is at least one member selected from the group consisting of organic halogen compounds, onium salts and sulfonic acid esters.

13. The negative photosensitive composition according to claim 1, wherein the photo-acid-generating material is an organic halogen compound.

14. The negative photosensitive composition according to claim 1, which comprises:

(a-1) an aromatic compound having at least two organic groups of formula (I):

wherein R¹ is an alkyl group, in its molecule and an alkali-soluble resin having phenolic groups, and (b) a photo-acid-generating material, said aromatic compound (a-1), upon acid decomposition of the —OCH₂OR¹ groups, acting as a cross-linking agent for the alkali-soluble resin, wherein the compound (a-1) having at least two organic groups of formula (I) in its molecule, is present in an amount ranging from 1–50 parts by weight, and the photo-acid-generating material is present in an amount ranging from 0.05 to 20 parts by weight, per 100 parts by weight of the alkali-soluble resin.

15. The negative photosensitive composition according to claim 14, wherein the compound having at least two organic groups of the formula (I) in its molecule, is from 5 to 30 parts by weight, and the photo-acid-generating material is from 0.1 to 10 parts by weight, per 100 parts by weight of the alkali-soluble resin.

16. The negative photosensitive composition according to claim 1, which comprises (a-2) an alkali-soluble resin having two organic groups of the formula (I) in its molecule, and (b) a photo-acid-generating material, wherein the photo-acid-generating material is from 1 to 100 parts by weight, per 100 parts by weight of the alkali-soluble resin having at least two organic groups of the formula (I) in its molecule.

17. The negative photosensitive composition according to claim 16, wherein the photo-acid-generating material is from 5 to 50 parts by weight, per 100 parts by weight of the alkali-soluble resin having at least two organic group of the formula (I) in its molecule.

18. The negative photosensitive composition according to claim 1, which contains a phenothiazine as a sensitizer.

19. A method for forming a resist pattern on a substrate for a semiconductor, which comprises:

coating on the substrate a negative photocomposition comprising (a-1) an aromatic compound having at least two organic groups of formula (I):

wherein R¹ is an alkyl group, in its molecule and an alkali-soluble resin having phenolic groups, or (a-2) an alkali-soluble resin having at least two organic groups of the formula (I) in its molecule; and (b) a photo-acid-generating material, said aromatic compound (a-1), upon acid decomposition of the —OCH₂OR¹ groups, acting as a cross-linking agent for the alkali-soluble resin;

exposing the coated substrate to light from a mercury lamp or an excimer laser to form a pattern on the coated substrate;

heat treating the exposed patterned substrate;

developing the patterned coated substrate with an aqueous alkali solution thereby forming a resist pattern on the substrate.

* * * * *